US012573447B2

(12) United States Patent
Chan

(10) Patent No.: US 12,573,447 B2
(45) Date of Patent: Mar. 10, 2026

(54) MEMORY SYSTEM

(71) Applicant: Winbond Electronics Corp., Taichung City (TW)

(72) Inventor: Kai-Lin Chan, Hsinchu County (TW)

(73) Assignee: Winbond Electronics Corp., Taichung City (TW)

( * ) Notice: Subject to any disclaimer, the term of this patent is extended or adjusted under 35 U.S.C. 154(b) by 106 days.

(21) Appl. No.: 18/623,041

(22) Filed: Apr. 1, 2024

(65) Prior Publication Data

US 2025/0239296 A1 Jul. 24, 2025

(30) Foreign Application Priority Data

Jan. 19, 2024 (TW) ................................. 113102284

(51) Int. Cl.
| | |
|---|---|
| *G11C 11/4091* | (2006.01) |
| *G11C 11/408* | (2006.01) |
| *G11C 11/4093* | (2006.01) |
| *G11C 11/4099* | (2006.01) |

(52) U.S. Cl.
CPC ...... *G11C 11/4087* (2013.01); *G11C 11/4093* (2013.01); *G11C 11/4099* (2013.01)

(58) Field of Classification Search
CPC ............ G11C 11/4087; G11C 11/4093; G11C 11/4099
See application file for complete search history.

(56) References Cited

U.S. PATENT DOCUMENTS

| | | | | |
|---|---|---|---|---|
| 5,715,209 | A | * | 2/1998 | Yoo ........................... G11C 8/12 |
| | | | | 365/230.03 |
| 5,822,268 | A | | 10/1998 | Kirihata |
| 5,949,732 | A | | 9/1999 | Kirihata |
| 7,684,240 | B2 | | 3/2010 | Cho |
| 8,085,609 | B2 | | 12/2011 | Shinoda |
| 8,773,890 | B2 | | 7/2014 | Ueda |
| 10,762,932 | B2 | | 9/2020 | Antonyan |
| 2021/0098064 | A1 | * | 4/2021 | Lee .................... G11C 13/0028 |
| 2024/0046978 | A1 | * | 2/2024 | Chan ................... G11C 11/4087 |

FOREIGN PATENT DOCUMENTS

TW I815583 9/2023

OTHER PUBLICATIONS

"Office Action of Taiwan Counterpart Application", issued on Mar. 31, 2025, p. 1-p. 6.

* cited by examiner

*Primary Examiner* — Min Huang
(74) *Attorney, Agent, or Firm* — JCIPRNET

(57) ABSTRACT

A memory system includes a first memory bank. The first memory bank includes multiple first memory cells, a first switch circuit, and a first local column decoder. The first memory cells are coupled to a first bit line. The first switch circuit is configured to, according to a voltage on a first local column select line, selectively couple the first bit line to a first local data line. The first local column decoder is configured to selectively couple the first local column select line to a global column select line, and selectively couple the first local column select line to a reference ground voltage.

20 Claims, 4 Drawing Sheets

MEMORY SYSTEM

CROSS-REFERENCE TO RELATED APPLICATION

This application claims the priority benefit of Taiwan application serial no. 113102284, filed on Jan. 19, 2024. The entirety of the above-mentioned patent application is hereby incorporated by reference herein and made a part of this specification.

BACKGROUND

Technical Field

The disclosure relates to a system, and more particularly, to a memory system.

Description of Related Art

As requirements for memory system capacity gradually increase, the number of memory banks in a memory system also increases. Under such circumstance, how to reduce an area of the memory system has become an important issue in a design of memory system.

SUMMARY

The disclosure provides a memory system, which may reduce a manufacturing cost of the memory system.

The disclosure provides a memory system, including a first memory bank. The first memory bank includes multiple first memory cells, a first switch circuit, and a first local column decoder. The first memory cells is coupled to a first bit line. The first switch circuit is configured to selectively couple the first bit line to a first local data line according to a voltage on a first local column select line. The first local column decoder is configured to selectively couple the first local column select line to a global column select line, and selectively couple the first local column select line to a reference ground voltage.

Based on the above, the memory system provided in the disclosure may realize the sharing of the column decoder between different memory banks at a lower hardware cost, thereby reducing the manufacturing cost of the memory system.

DETAILED DESCRIPTION OF DISCLOSED EMBODIMENTS

Figure 1:
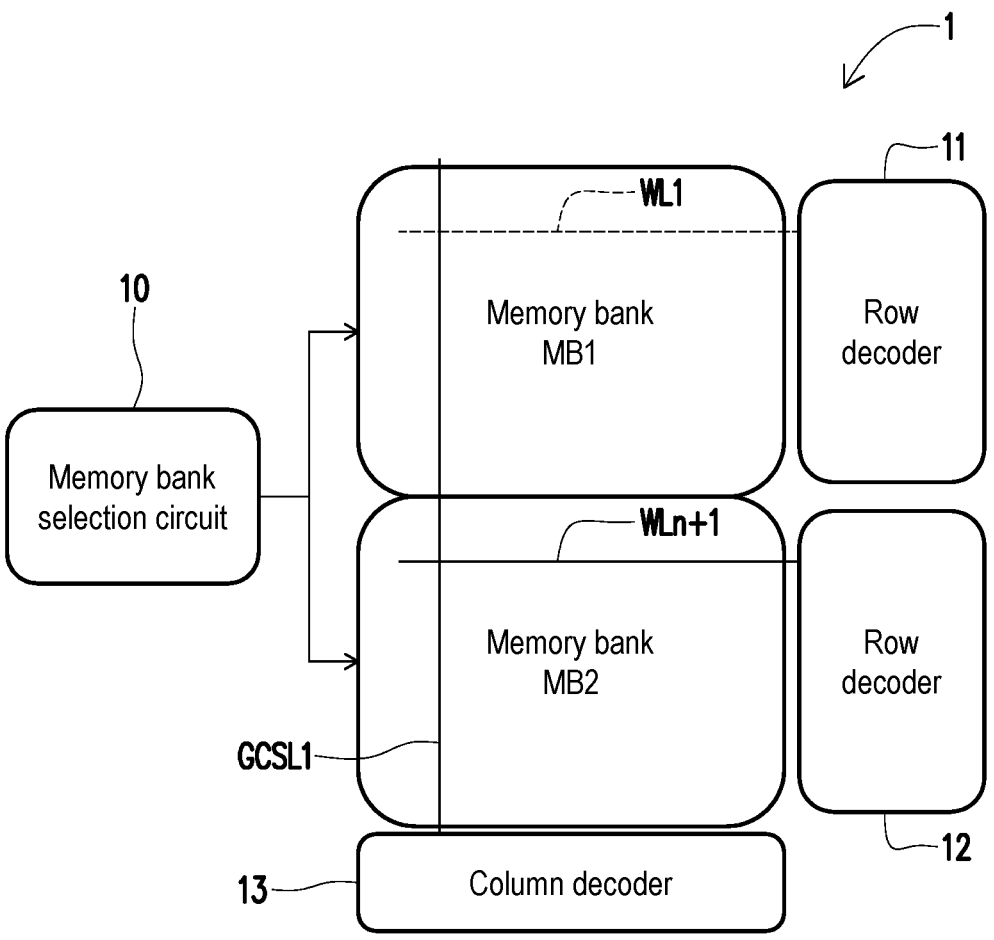
FIG. 1 is a schematic circuit diagram of a memory system according to an embodiment of the disclosure.

FIG. 1 is a schematic circuit diagram of a memory system 1 according to an embodiment of the disclosure. The memory system 1 includes memory banks MB1 and MB2, a memory bank selection circuit 10, row decoders 11 and 12, and a column decoder 13. In this embodiment, the memory banks MB1 and MB2 are controlled by the corresponding row decoders 11 and 12 respectively, and the memory banks MB1 and MB2 share the same column decoder 13. That is to say, a word line in the memory bank MB1 may be driven by the row decoder 11, and a word line in the memory bank MB2 may be driven by the row decoder 12. In addition, the column decoder 13 may drive corresponding columns in the memory banks MB1 and MB2 through a global column select line. Since one global column select line is connected to the corresponding columns in the memory banks MB1 and MB2 at the same time, in the memory system 1, it is also necessary to select the memory banks MB1 and MB2 through the memory bank selection circuit 10, so that the selected memory bank may be operated through the global column select line, while the unselected memory bank will not receive control from the global column select line. In this way, only one column decoder 13 is required in the memory system 1 to control both the memory banks MB1 and MB2, thereby effectively reducing a manufacturing cost of the memory system 1.

Figure 2:
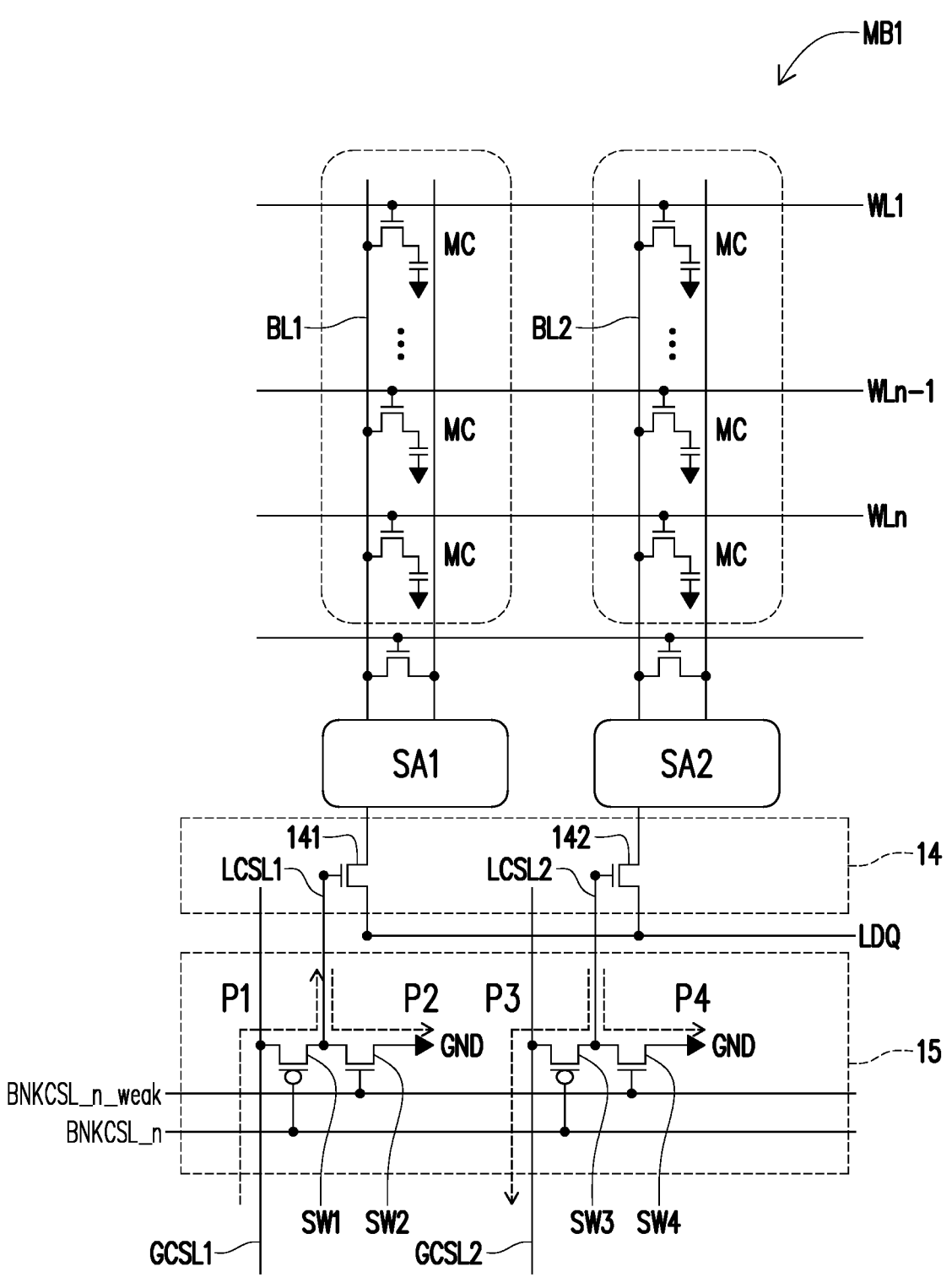
FIG. 2 is a schematic circuit diagram of a memory bank in FIG. 1.

FIG. 2 is a schematic circuit diagram of the memory bank MB1 in FIG. 1. The memory bank MB1 includes multiple memory cells MC, sensing amplifiers SA1 and SA2, a switch circuit 14, and a local column decoder 15. The memory cells MC are arranged in a form of an array. The memory cells MC in the same row will be coupled to the same word line, and the memory cells MC in the same column will be coupled to the same bit line. The memory cell MC may be applied, for example, to a DRAM, which includes a selector and a memory element connected in series. The selector may be controlled by the word line, so that the memory element may be read and/or written through the bit line. In some embodiments, the memory cells MC in the same column are further coupled to the same source line. The sensing amplifiers SA1 and SA2 are respectively coupled to the bit lines of the corresponding columns in the memory bank MB1 to read the bit lines of the corresponding columns. The switch circuit 14 includes multiple switches, which are respectively coupled to the corresponding sensing amplifiers. The switch circuit 14 is controlled by the local column decoder 15 to selectively provide a sensing result of the sensing amplifiers SA1 and SA2 to a local data line LDQ. More specifically, the local column decoder 15 receives select signals BNKCSL_n and BNKCSL_n_weak, and then selectively couples a local column select line of each of the columns to the corresponding global column select line and selectively couples the local column select line of each of the columns to a reference ground voltage.

In FIG. 2, for convenience of description, only two columns in the memory bank MB1 are shown for description. However, those with common knowledge in the art may certainly change the number of columns and/or rows of the memory banks MB1 in FIG. 2 according to different design requirements, which all fall within a scope of variation of the embodiment of the memory system 1.

In some embodiments, when the memory bank MB1 is selected, the corresponding select signals BNKCSL_n and BNKCSL_n_weak may be provided to the local column decoder 15, so that the local column decoder 15 may control the switch circuit 14 to be conductive according to the signal transmitted on the global column select line, and read data from the memory cells MC. When the memory bank MB1 is not selected, the local column decoder 15 may control the switch circuit 14 to be nonconductive according to the corresponding select signals BNKCSL_n and BNKCSL_n_weak.

Specifically, in the memory bank MB1, the sensing amplifier of each of the columns is connected to one corresponding switch in the switch circuit 14 to control whether the sensing amplifier of each of the columns is coupled to the local data line LDQ. Furthermore, a control end of each of the switches in the switch circuit 14 is coupled to one corresponding local column select line, and each of the local column select lines is coupled to two switches of the local column decoder 15. One of the switches of the local column decoder 15 will receive the select signal BNKCSL_n to control whether to couple the global column select line to the control end of the switch of the switch circuit 14. The other of the switches of the local column decoder 15 will receive the select signal BNKCSL_n_weak to selectively couple the control end of the switch of the switch circuit 14 to a reference ground voltage GND.

For example, taking the first column of the memory banks MB1 in FIG. 2 as an example, the memory cells MC of the first column of the memory bank MB1 are connected to a bit line BL1. After the sensing amplifier SA1 is coupled to the bit line BL1 for reading, a switch 141 in the switch circuit 14 will receive the control of the local column decoder 15 through a local column select line LCSL1, and accordingly determine whether to provide a reading result of the sensing amplifier SA1 to the local data line LDQ. In the local column decoder 15, switches SW1 and SW2 are coupled to a control end of the switch 141 through the local column select line LCSL1 to control a voltage of the control end of the switch 141 according to the select signals BNKCSL_n and BNKCSL_n_weak respectively. More specifically, the switch SW1 is coupled between a global column select line GCSL1 and the control end of the switch of the switch circuit 14, and a control end of the switch SW1 receives the select signal BNKCSL_n. The switch SW2 is coupled between the control end of the switch of the switch circuit 14 and the reference ground voltage GND, and a control end of the switch SW2 receives the select signal BNKCSL_n_weak.

Further, when the memory bank MB1 is selected, the in-phase select signals BNKCSL_n and BNKCSL_n_weak may be provided to the local column decoder 15. However, since a voltage of the select signal BNKCSL_n has a greater pull-down amplitude than a voltage of the select signal BNKCSL_n_weak, the switch SW1 has stronger driving capability and thus dominates the voltage of the control end of the switch in the switch circuit 14. For example, when the memory bank MB is selected, the select signal BNKCSL_n is, for example, pulled down from a reference operation voltage VDD to the reference ground voltage GND. The select signal BNKCSL_n is, for example, pulled down from the reference operation voltage VDD to a preset voltage (e.g., a threshold voltage of the switch SW2). In the example of FIG. 2, the switches SW1 and SW2 are a P-type transistor and an N-type transistor respectively. When the memory bank MB1 is selected, the select signal BNKCSL_n pulled down to the reference ground voltage GND may turn on the switch SW1, so that the global column select line GCSL1 is coupled to the control end of the switch 141. In addition, the select signal BNKCSL_n_weak pulled down to the threshold voltage may control the switch SW2 to be slightly conductive or weakly conductive, so that the control end of the switch 141 discharges the reference ground voltage GND.

Further, assuming that a voltage on the global column select line GCSL1 is a high voltage corresponding to logic 1, when the switch SW1 is turned on, and the global column select line GCSL1 is coupled to the control end of the switch 141, the control end of the switch 141 may be charged according to a current path P1. In addition, when the switch SW2 is turned on, and the reference ground voltage GND is coupled to the control end of the switch 141, the control end of the switch 141 may be discharged by a current path P2. Specifically, the select signal BNKCSL_n may control the switch SW1 in a saturation region, and the select signal BNKCSL_n_weak may control the switch SW2 in, for example, a subcritical region or a linear region. A voltage difference of the select signals BNKCSL_n and BNKCSL_n_weak causes a difference in the driving capabilities of the switches SW1 and SW2. When the switches SW1 and SW2 provide the current paths P1 and P2 respectively to charge and discharge the control end of the switch 141, the switch SW1 may dominate the voltage at the control end of the switch 141 through the strong driving capability thereof, thereby charging the control end of the switch 141 to the same voltage as the global column select line GCSL1, that is, pulled up to the high voltage corresponding to the logic 1.

Since the switches SW1 and SW2 are controlled by the select signals BNKCSL_n and BNKCSL_n_weak with different voltage amplitudes, the switches SW1 and SW2 have different driving capabilities. For example, when the memory bank MB1 is selected, equivalent impedance of the switch SW1 is lower than equivalent impedance of the switch SW2, so that a current flowing through the current path P1 is greater than a current flowing through the current path P2, thus causing the voltage at the control end of the switch 141 to be dominated by the voltage on the global column select line GCSL1.

In addition, taking the second column of the memory banks MB1 as an example, assuming that a voltage on a global column select line GCSL2 is a low voltage corresponding to logic 0, when a switch SW3 is turned on, and the global column select line GCSL2 is coupled to a local column select line LCSL2, a control end of a switch 142 may be discharged according to a current path P3. In addition, when a switch SW4 is turned on and couples the reference ground voltage GND to the local column select line LCSL2, the control end of the switch 142 may be discharged by a current path P4. However, when the switch SW3 is discharging, due to characteristics of the P-type transistor, the switch SW3 may only discharge the control end of the switch 142 to a threshold voltage of the P-type transistor in the switch SW3. As a result, the switch 142 that is not fully discharged may cause an error when the memory bank MB1 is read. Therefore, as an auxiliary, the switch SW4 may provide the current path P4 at the same time to discharge the control end of the switch 142 to the reference ground voltage GND, so that the switch 142 may be truly nonconductive, thereby improving an operation of the memory system 1.

To put it simply, in the memory bank MB1, the local column decoder 15 will provide two switches for a read operation switch of each of the columns in the switch circuit 14. The two switches are respectively controlled by the select signals BNKCSL_n and BNKCSL_n_weak, have different driving capabilities, and may respectively couple the global column select line or the reference ground voltage to a control end of the read operation switch. In this way, a voltage on the control end of the read operation switch may be dominated by the voltage on the global column select line through the switch controlled by the select signal BNKCSL_n. At the same time, as an auxiliary, the switch controlled by the select signal BNKCSL_n_weak may provide a discharge path without affecting a control end logic of the read operation switch, so that when the voltage on the global column select line is the low voltage corresponding to the logic 0, the control end of the read operation switch is discharged to the reference ground voltage, thereby improving the read operation of the memory system 1.

Figure 3A:
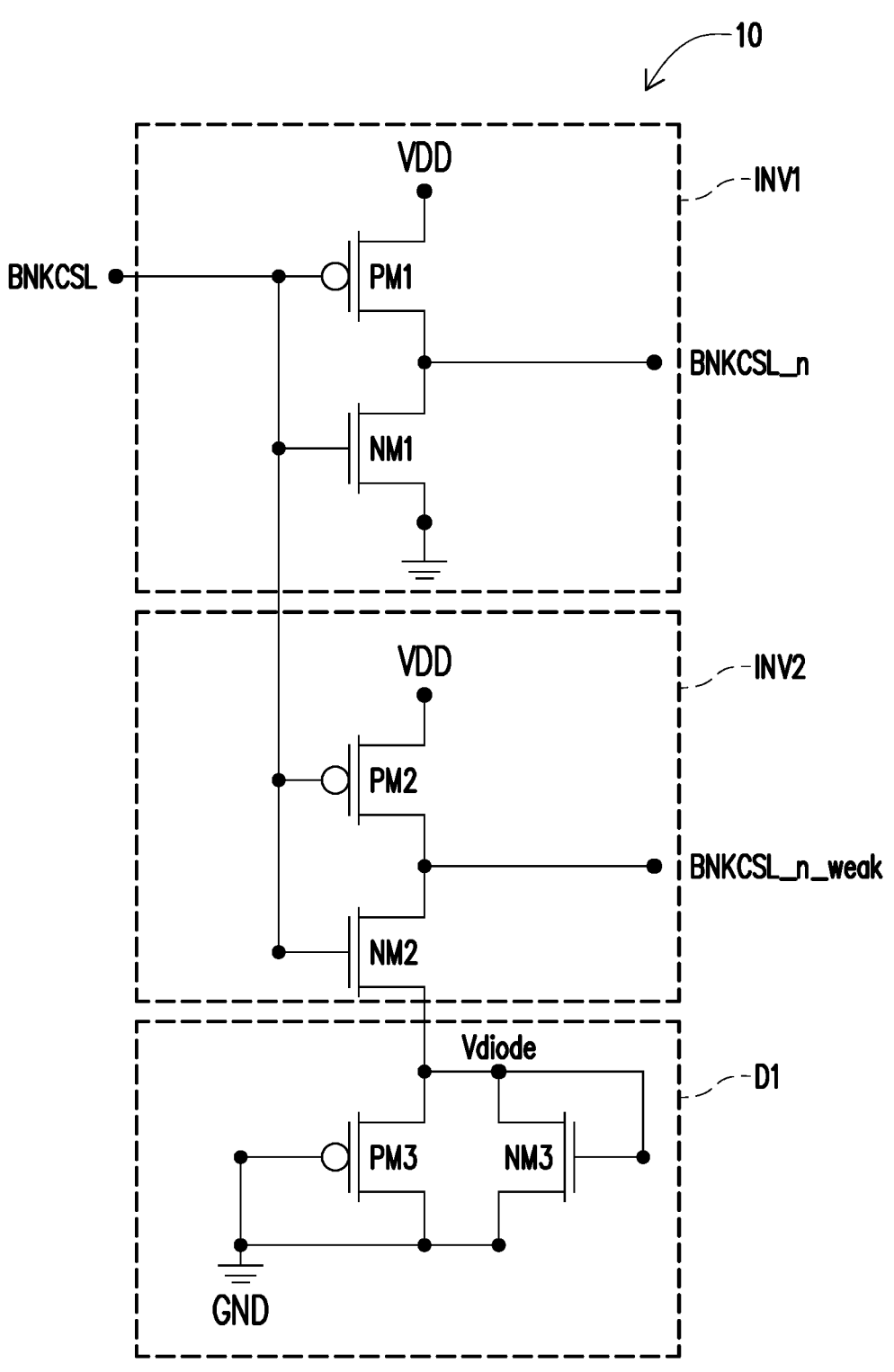
FIG. 3A is a circuit block diagram of a memory bank selection circuit in FIG. 1.

FIG. 3A is a circuit block diagram of the memory bank selection circuit 10 in FIG. 1. The memory bank selection circuit 10 may be used to receive a select signal BNKCSL to generate the select signals BNKCSL_n and BNKCSL_n_weak that are in-phase but have different voltage amplitudes. The memory bank selection circuit includes inverters INV1 and INV2 and a diode circuit D1. The inverter INV1 is coupled between the reference operation voltage VDD and the reference ground voltage GND. An input end of the inverter INV1 receives the select signal BNKCSL and generates the select signal BNKCSL_n at an output end. The inverter INV2 is coupled between the reference operation voltage VDD and the diode circuit D1, and is coupled to the reference ground voltage GND through the diode circuit D1. An input end of the inverter INV2 receives the select signal BNKCSL and generates the select signal BNKCSL_n_weak at an output end.

Specifically, the inverter INV1 includes transistors PM1 and NM1 connected in series between the reference operation voltage VDD and the reference ground voltage GND. The inverter INV2 includes transistor PM2 and NM2 connected in series between the reference operation voltage VDD and the diode circuit D1. The diode circuit D1 includes diode-connected transistors PM3 and NM3. An anode of the diode circuit D1 is coupled to a source of the transistor NM2, and a cathode of the diode circuit D1 is coupled to the reference ground voltage GND. In this way, the memory bank selection circuit 10 may generate the select signals BNKCSL_n and BNKCSL_n_weak with different amplitudes according to a coupling relationship between the inverters INV1 and INV2 and the diode circuit D1.

Figure 3B:
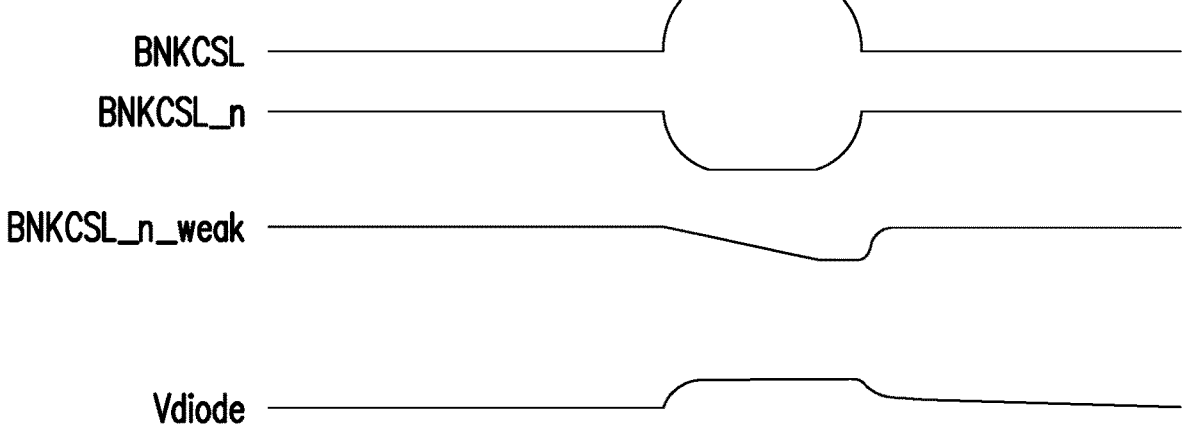
FIG. 3B is a schematic waveform diagram of the memory bank selection circuit in FIG. 3A.

FIG. 3B is a schematic waveform diagram of the memory bank selection circuit 10 in FIG. 3A. FIG. 3B shows the select signals BNKCSL, BNKCSL_n, and BNKCSL_n_weak, the inverter INV2, and an anode voltage V diode of the diode circuit D1.

As shown in FIG. 3B, when the select signal BNKCSL switches from the low voltage to the high voltage, BNKCSL_n may be pulled down from the reference operation voltage VDD to the reference ground voltage GND by the inverter INV1. At the same time, the pulled-up select signal BNKCSL also turns on the transistor NM2, so that the diode circuit D1 is turned on, and the anode voltage V diode of the diode circuit D1 is maintained at a threshold voltage of the diode circuit D1. Furthermore, the rising anode voltage V diode of the diode circuit D1 may cause the select signal BNKCSL_n_weak generated by the inverter INV2 to be pulled down with a gentler slope, thus causing a fall time of the select signal BNKCSL_n to be less than a fall time of the select signal BNKCSL_n_weak. In addition, due to limitation of the diode circuit D1 coupled to the source of the transistor NM2, the inverter INV2 may only pull down the select signal BNKCSL_n_weak to the threshold voltage of the diode circuit D1, which is higher than the reference ground voltage GND at which the inverter INV1 pulls down the select signal BNKCSL_n.

In this way, when the select signal BNKCSL switches from the low voltage to the high voltage, the select signal BNKCSL_n may be pulled down from the reference operation voltage VDD to the reference ground voltage GND by the inverter INV1, and the select signal BNKCSL_n_weak may be pulled down from the reference operation voltage VDD to the threshold voltage of the diode circuit D1 by the inverter INV2 and the diode circuit D1. Therefore, the select signals BNKCSL_n and BNKCSL_n_weak with different voltage amplitudes generated by the memory bank selection circuit 10 may operate the switches in the local column decoder 15 under different driving capabilities, thereby effectively improving the operation of the memory system 1.

Based on the above, the memory system in the disclosure may effectively reduce a hardware cost of the local column decoder while maintaining the correct read operation when sharing the column decoder. More specifically, for each of the columns of the memory banks, the local column decoder is only required to be provided with two transistors to correctly control the read operation of each of the columns. Therefore, the hardware cost is reduced while maintaining the correct operation of the memory system.

What is claimed is:

1. A memory system, comprising:
a first memory bank, comprising:
    a plurality of first memory cells coupled to a first bit line;
    a first switch circuit configured to selectively couple the first bit line to a first local data line according to a voltage on a first local column select line; and
    a first local column decoder configured to selectively couple the first local column select line to a global column select line through a first signal path, and selectively couple the first local column select line to a reference ground voltage through a second signal path, wherein a driving capability of the first signal path is stronger than a driving capability of the second signal path.

2. The memory system according to claim 1, wherein when the first memory cells of the first memory bank are selected, the first local column decoder couples the first local column select line to the global column select line, and couples the first local column select line to the reference ground voltage at the same time.

3. The memory system according to claim 1, wherein the first local column decoder comprises a first switch and a second switch, the first switch is coupled between the first local column select line and the global column select line, and the second switch is coupled between the first local column select line and the reference ground voltage.

4. The memory system according to claim 3, wherein when the first memory cells of the first memory bank are selected, the first switch couples the first local column select line to the global column select line, the second switch couples the first local column select line to the reference ground voltage, and a driving capability of the first switch is greater than a driving capability of the second switch.

5. The memory system according to claim 4, wherein the first switch is a P-type metal oxide semiconductor field effect transistor, the second switch is an N-type metal oxide semiconductor field effect transistor, and phases of a first select signal and a second select signal respectively received by the first switch and the second switch are the same.

6. The memory system according to claim 5, wherein when the first memory cells of the first memory bank are selected, the first select signal and the second select signal are pulled down, and a fall time of the first select signal is less than a fall time of the second select signal.

7. The memory system according to claim 1, further comprising:
a second memory bank, comprising:
    a plurality of second memory cells coupled to a second bit line;

a second switch circuit configured to selectively couple the second bit line to a second local data line according to a voltage on a second local column select line; and a second local column decoder configured to selectively couple the second local column select line to the global column select line, and selectively couple the second local column select line to the reference ground voltage.

8. The memory system according to claim 7, wherein when the first memory cells of the first memory bank are selected, the second memory cells of the second memory bank are not selected.

9. The memory system according to claim 5, further comprising:

a memory bank selection circuit coupled to the first local column decoder, wherein a control circuit is configured to generate the first select signal and the second select signal to control an operation of the first local column decoder, wherein an amplitude of the first select signal is larger than an amplitude of the second select signal.

10. The memory system according to claim 9, wherein the memory bank selection circuit comprises:

a diode circuit having two ends, wherein one of the ends is configured to receive the reference ground voltage;

a first inverter coupled between a reference operation voltage and the reference ground voltage, wherein the first inverter is configured to receive a select signal to generate the first select signal; and a second inverter coupled between the reference operation voltage and the other of the ends of the diode circuit, wherein the second inverter is configured to receive the select signal to generate the second select signal.

11. The memory system according to claim 10, wherein the first select signal is between the reference operation voltage and the reference ground voltage, and the second select signal is between the reference operation voltage and a threshold voltage of the diode circuit.

12. A memory system, comprising:

a global column select line;

a first memory bank, comprising:

a first local column select line configured to control output of a first column of the first memory bank; and a first local column decoder configured to selectively couple the first local column select line to the global column select line through a first signal path, and selectively couple the first local column select line to a reference ground voltage through a second signal path, wherein a driving capability of the first signal path is stronger than a driving capability of the second signal path; and a second memory bank, comprising:

a second local column select line configured to control output of a first column of the second memory bank; and a second local column decoder configured to selectively couple the second local column select line to the global column select line through a third signal path, and selectively couple the second local column select line to the reference ground voltage through a fourth signal path, wherein a driving capability of the third signal path is stronger than a driving capability of the fourth signal path.

13. The memory system according to claim 12, wherein when the first memory bank is selected, the first local column decoder couples the first local column select line to the global column select line, and couples the first local column select line to the reference ground voltage at the same time.

14. The memory system according to claim 12, wherein the first local column decoder comprises a first switch and a second switch, the first switch is coupled between the first local column select line and the global column select line, and the second switch is coupled between the first local column select line and the reference ground voltage.

15. The memory system according to claim 14, wherein when first memory bank is selected, the first switch couples the first local column select line to the global column select line, the second switch couples the first local column select line to the reference ground voltage, and a driving capability of the first switch is greater than a driving capability of the second switch.

16. The memory system according to claim 15, wherein the first switch is a P-type metal oxide semiconductor field effect transistor, the second switch is an N-type metal oxide semiconductor field effect transistor, and phases of a first select signal and a second select signal respectively received by the first switch and the second switch are the same.

17. The memory system according to claim 16, wherein when the first memory bank is selected, the first select signal and the second select signal are pulled down, and a fall time of the first select signal is less than a fall time of the second select signal.

18. The memory system according to claim 7, wherein when the first memory bank is selected, the second memory bank is unselected.

19. The memory system according to claim 16, further comprising:

a memory bank selection circuit coupled to the first local column decoder, wherein a control circuit is configured to generate the first select signal and the second select signal to control an operation of the first local column decoder, wherein an amplitude of the first select signal is larger than an amplitude of the second select signal.

20. The memory system according to claim 19, wherein the memory bank selection circuit comprises:

a diode circuit having two ends, wherein one of the ends is configured to receive the reference ground voltage;

a first inverter coupled between a reference operation voltage and the reference ground voltage, wherein the first inverter is configured to receive a select signal to generate the first select signal; and a second inverter coupled between the reference operation voltage and the other of the ends of the diode circuit, wherein the second inverter is configured to receive the select signal to generate the second select signal.

* * * * *